US006243849B1

United States Patent
Singh et al.

(10) Patent No.: US 6,243,849 B1
(45) Date of Patent: Jun. 5, 2001

(54) METHOD AND APPARATUS FOR NETLIST FILTERING AND CELL PLACEMENT

(75) Inventors: Virinder Singh, Fremont; Mike Liang, Milpitas, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/042,230

(22) Filed: Mar. 13, 1998

(51) Int. Cl.[7] .................................................. G06F 17/50
(52) U.S. Cl. .................................................. 716/8; 716/12
(58) Field of Search .................................. 364/488, 489, 364/490, 491; 395/500.02, 500.09, 500.11; 716/1, 2, 3, 8, 9, 10, 11, 12, 18, 13, 14

(56) References Cited

U.S. PATENT DOCUMENTS

| | | | |
|---|---|---|---|
| 5,384,710 | * 1/1995 | Lam et al. ............................. | 364/489 |
| 5,396,435 | * 3/1995 | Ginetti et al. ........................ | 364/489 |
| 5,452,227 | * 9/1995 | Kelsey et al. ........................ | 364/489 |
| 5,526,276 | * 6/1996 | Cox et al. ............................. | 716/17 |
| 5,526,278 | * 6/1996 | Powell .................................. | 716/16 |
| 5,548,524 | * 8/1996 | Hernandez et al. ................. | 364/489 |
| 5,586,319 | * 12/1996 | Bell ..................................... | 395/701 |
| 5,644,498 | * 7/1997 | Joly et al. ............................. | 716/2 |
| 5,737,234 | * 4/1998 | Seidel et al. ......................... | 364/488 |
| 5,754,826 | * 5/1998 | Gamal et al. ........................ | 395/500 |

(List continued on next page.)

OTHER PUBLICATIONS

Lu and Alston "An Automated, Structured Layout Methodology for Staggered Pad, I/O–Bound ASIC Design," Proceedings of the Third Annual IEEE ASIC SEminar and Exhibit, Sep. 17–21, 1990, p. 11/6.1–11/6.4.*

Rose et al. "Dense, Performance Directed, Auto Place and Route," Proceedings of the IEEE 1988 Custom Integrated Circuits Conference, May 16–19, 1988, p. 11.1/1–11.1/4.*

Lin et al. "Lake: A Performance–Driven Analog CMOS CEll Layout Generator," 1994 IEEE Asia–Pacific Conference on Circuits and Systems, Dec. 5–8, 1994, p. 564–569.*

Kostelijk and DeLoore "Automatic Verification of Laibrary–Based IC Designs," IEEE Journal of Solid–State Circuits, vol. 26, No. 3, Mar. 1991, p. 394–403.*

Hill et al. "Placement Algorithms for CMOS Cell Synthesis," 1990 IEEE International Conference on Computer Design: VLSI in Computers and Processors, Sep. 17–19, 1990, p. 454–458.*

Costa et al. "Symbolic Generation of Constrained Random Logic Cells," IEEE ransactions on Computer–Aided Design, vol. 10, No. 2, Feb. 1991, p. 220–231.*

Cheng and Ho "SEFOP: A Novel Approach to Data Path Module Placement," 1993 IEEE/ACM International Conference on Computer–Aided Design, Nov. 7–11, 1993, p. 178–181.*

Aeribi and Vannelli "An Efficient Clustering Technique for Circuit Partitioning," 1996 IEEE International Symposium on Circuits and Systems, May 12–15, 1996, p. 671–674, vol. 4.*

Primary Examiner—Matthew Smith
Assistant Examiner—Leigh Marie Garbowski
(74) Attorney, Agent, or Firm—Mitchell, Silberberg & Knupp LLP

(57) ABSTRACT

Integrated circuit chip (IC) design and fabrication is a complex process requiring many stages including elaborate cell placement processes. The present invention provides a method and apparatus to facilitate the placement of cells on the surface of an integrated circuit device. Specifically, the invention involves placement of one type of cells (such as logic cells, I/O cells or scan cells) apart from other types of cells. The present invention facilitates the placement of such cells by first parsing the netlist to remove all cells other than the specific type of cells that are to be placed.

13 Claims, 3 Drawing Sheets

U.S. PATENT DOCUMENTS

| | | | |
|---|---|---|---|
| 5,757,658 | * | 5/1998 | Rodman et al. ................... 364/491 |
| 5,815,402 | * | 9/1998 | Taylor et al. ..................... 364/488 |
| 5,818,729 | * | 10/1998 | Wang et al. ....................... 364/491 |
| 5,856,927 | * | 1/1999 | Greidinger et al. ............... 364/491 |
| 5,867,395 | * | 2/1999 | Watkins et al. ..................... 716/18 |
| 5,867,396 | * | 2/1999 | Parlour ............................... 364/489 |
| 5,875,118 | * | 2/1999 | Scepanovic et al. ............ 364/491 |
| 6,009,251 | * | 12/1999 | Ho et al. ............................... 716/5 |

* cited by examiner

METHOD AND APPARATUS FOR NETLIST FILTERING AND CELL PLACEMENT

BACKGROUND OF THE INVENTION

1. Field of Invention

This invention relates to the field of semiconductor design and fabrication. Specifically, this invention relates to the technique of filtering of netlist to facilitate the placement of particular cells on an integrated circuit chip.

2. Description of the Related Art

Cell placement in semiconductor fabrication involves determining placement of particular cells on the surface of a integrated circuit device. As is described more fully below, there are different types of cells to be placed, including core cells (such as logic cells), I/O cells (input/output cells) and scan cells. Some cell placement systems place different cells at different stages of the design process. For example, I/O cells are generally placed at the periphery of the integrated circuit device and can be placed before the core cells are placed in the core (middle) of the device. The purpose of the present invention is to facilitate the placement of cells where different cells are placed at different stages of the integrated circuit design process.

a. Integrated Circuit Basics

An integrated circuit chip (hereafter referred to as an "IC" or a "chip") comprises cells and connections between the cells formed on a surface of a semiconductor substrate. The IC may include a large number of cells and require complex connections between the cells.

A cell is a group of one or more circuit elements such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip. As discussed above, the cells can include core cells, scan cells and I/O cells.

A net is a set of two or more pins which must be connected, thus connecting the logic circuits having the pins. Because a typical chip has thousands, tens of thousands, or hundreds of thousands of pins, that must be connected in various combinations, the chip also includes definitions of thousands, tens of thousands, or hundreds of thousands of nets, or sets of pins. The number of the nets for a chip is typically in the same order as the order of the number of cells on that chip. Commonly, a majority of the nets include only two pins to be connected; however, many nets comprise three or more pins. Some nets may include hundreds of pins or thousands or tens of thousands to be connected. A netlist is a list of nets including names of connected pins or a list of cells including names of nets that connect to pins of cells.

b. Chip Fabrication

As mentioned above, the present invention involves cell placement. Cell placement is one of the steps necessary for the fabrication of an IC. These additional steps are very well known by those skilled in the art of semiconductor fabrication and are briefly described below.

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design.

Currently, the minimum geometric feature size of a component is on the order of 0.2 microns. However, it is expected that the feature size can be reduced to 0.1 micron within the next few years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality.

An exemplary integrated circuit chip is illustrated in FIG. 1 and generally designated by the reference numeral 26. The circuit 26 includes a semiconductor substrate 26A on which are formed a number of functional circuit blocks that can have different sizes and shapes. Some are relatively large, such as a central processing unit (CPU) 27, a read-only memory (ROM) 28, a clock/timing unit 29, one or more random access memories (RAM) 30 and an input/output (I/O) interface unit 31. These blocks, commonly known as macroblocks, can be considered as modules for use in various circuit designs, and are represented as standard designs in circuit libraries.

The integrated circuit 26 further comprises a large number, which can be tens of thousands, hundreds of thousands or even millions or more of small cells 32. Each cell 32 shown herein represents a single logic element, such as a gate, or several logic elements interconnected in a standardized manner to perform a specific function. Cells that consist of two or more interconnected gates or logic elements are also available as standard modules in circuit libraries.

The cells 32 and the other elements of the circuit 26 described above are interconnected or routed in accordance with the logical design of the circuit to provide the desired functionality. Although not visible in the drawing, the various elements of the circuit 26 are interconnected by electrically conductive lines or traces that are routed, for example, through vertical channels 33 and horizontal channels 34 that run between the cells 32.

The input to the physical design problem is a circuit diagram, and the output is the layout of the circuit. This is accomplished in several stages including partitioning, floor planning, placement, routing and compaction.

Partitioning. A chip may contain several million transistors. Layout of the entire circuit cannot be handled due to the limitation of memory space as well as the computation power available. Therefore it is normally partitioned by grouping the components into blocks such as subcircuits and modules. The actual partitioning process considers many factors such as the size of the blocks, number of blocks and number of interconnections between the blocks.

The output of partitioning is a set of blocks, along with the interconnections required between blocks. The set of interconnections required is the netlist. In large circuits, the partitioning process is often hierarchical, although non-hierarchical (e.g. flat) processes can be used, and at the topmost level a circuit can have between 5 to 25 blocks. However, greater numbers of blocks are possible and contemplated. Each block is then partitioned recursively into smaller blocks.

Floor planning and placement. This step is concerned with selecting good layout alternatives for each block of the entire chip, as well as between blocks and to the edges. Floor planning is a critical step as it sets up the ground work for a good layout. During cell placement, the blocks are exactly positioned on the chip. The goal of cell placement is to find a minimum area arrangement for the blocks (cells) that allows completion of interconnections between the blocks. Placement is typically done in two phases. In the first phase, an initial placement is created. In the second phase, the initial placement is evaluated and iterative improvements are made until the layout has minimum area and conforms to design specifications.

Routing, The objective of the routing phase is to complete the interconnections between blocks according to the specified netlist. First, the space not occupied by blocks, which is called the routing space, is partitioned into rectangular regions called channels and switch boxes. The goal of a router is to complete all circuit connections using the shortest possible wire length and using only the channel and switch boxes.

Routing is usually done in two phases referred to as the global routing and detailed routing phases. In global routing, connections are completed between the proper blocks of the circuit disregarding the exact geometric details of each wire and terminal. For each wire, a global router finds a list of channels that are to be used as a passageway for that wire. In other words, global routing specifies the loose route of a wire through different regions of the routing space.

Global routing is followed by detailed routing which completes point-to-point connections between terminals on the blocks. Loose routing is converted into exact routing by specifying the geometric information such as width of wires and their layer assignments. Detailed routing includes channel routing and switch box routing.

Compaction. Compaction is the task of compressing the layout in all directions such that the total area is reduced. By making the chips smaller, wire lengths are reduced which in turn reduces the signal delay between components of the circuit. At the same time a smaller area enables more chips to be produced on a wafer which in turn reduces the cost of manufacturing. Compaction must ensure that no rules regarding the design and fabrication process are violated.

Wafer Construction. Photolithography is a common technique employed in the manufacture of semiconductor devices. Typically, a semiconductor wafer is coated with a layer (film) of light-sensitive material, such as photoresist. Using a patterned mask or reticle, the wafer is exposed to projected light, typically actinic light, which manifests a photochemical effect on the photoresist, which is subsequently chemically etched, leaving a pattern of photoresist "lines" on the wafer corresponding to the pattern on the mask.

A "wafer" is a thin piece of semiconductor material from which semiconductor chips are made. The four basic operations utilized to fabricate wafers include (1) layering, (2) patterning, (3) doping and (4) heat treatments.

The layering operation adds thin layers of material, including insulators, semiconductors, and conductors, to a wafer surface. During the layering operation, layers are either grown or deposited. Oxidation involves growing a silicon dioxide (an insulator) layer on a silicon wafer. Deposition techniques include, for example, chemical vapor deposition, evaporation, and sputtering. Semiconductors are generally deposited by chemical vapor deposition, while conductors are generally deposited with evaporation or sputtering.

Patterning involves the removal of selected portions of surface layers. After material is removed, the wafer surface has a pattern. The material removed may form a hole or an island. The process of patterning is also known to those skilled in the relevant art as microlithography, photolithography, photomasking and masking. The patterning operation serves to create parts of the semiconductor device on the wafer surface in the dimensions required by the circuit design and to locate the parts in their proper location on the wafer surface.

Doping involves implanting dopants in the surface of the wafer through openings in the layers to create the n-type and p-type pockets needed to form the N-P junctions for operation of discrete elements such as transistors and diodes. Doping is generally achieved with thermal diffusion (wafer is heated and exposed to the desired dopant) and ion implantation (dopant atoms are ionized, accelerated to high velocities and implanted into the wafer surface).

c. Cell Placement.

During the cell placement process described above, different cells may be placed at different stages of the design process. For example, it may be desirable to place I/O cells before placing the core cells. LSI Logic Corporation, for example, offers a well-known design tool called "LSI I/O Only" which places I/O cells separate and apart from the placement of other cells. One problem confronted by a design tool such as "LSI I/O Only" is that generally the entire netlist (which includes core cells, scan cells and I/O cells) must be read in and acted upon by the tool. Considering the size of a netlist for a very large scale integration, the processing of such a large netlist is very expensive with respect to computer resources. Therefore, it is an object of the present invention to reduce the complexity of the netlist in order to facilitate the placement of specific types of cells apart from the other cells of the netlist.

SUMMARY OF THE INVENTION

The present invention provides a method and apparatus to facilitate the placement of cells on the surface of an integrated circuit device. Specifically, the invention involves placement of one type of cells (such as logic cells, I/O cells or scan cells) apart from other types of cells. The present invention facilitates the placement of such cells by first parsing the netlist to remove all cells other than the specific type of cells that are to be placed.

DESCRIPTION OF THE PREFERRED EMBODIMENTS.

Figure 1:
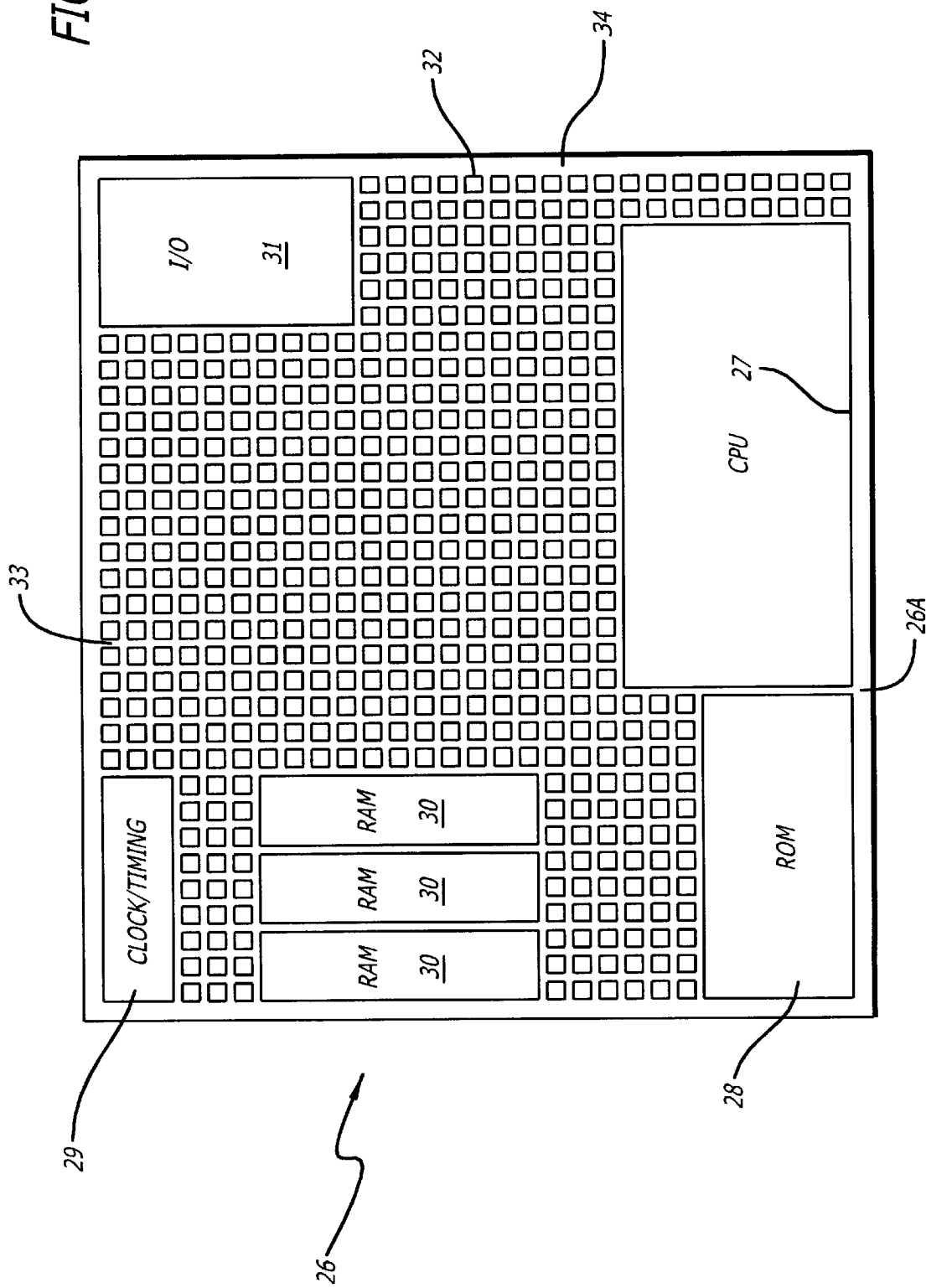
FIG. 1 is a simplified illustration of an integrated circuit chip on a semiconductor substrate.
Figure 2:
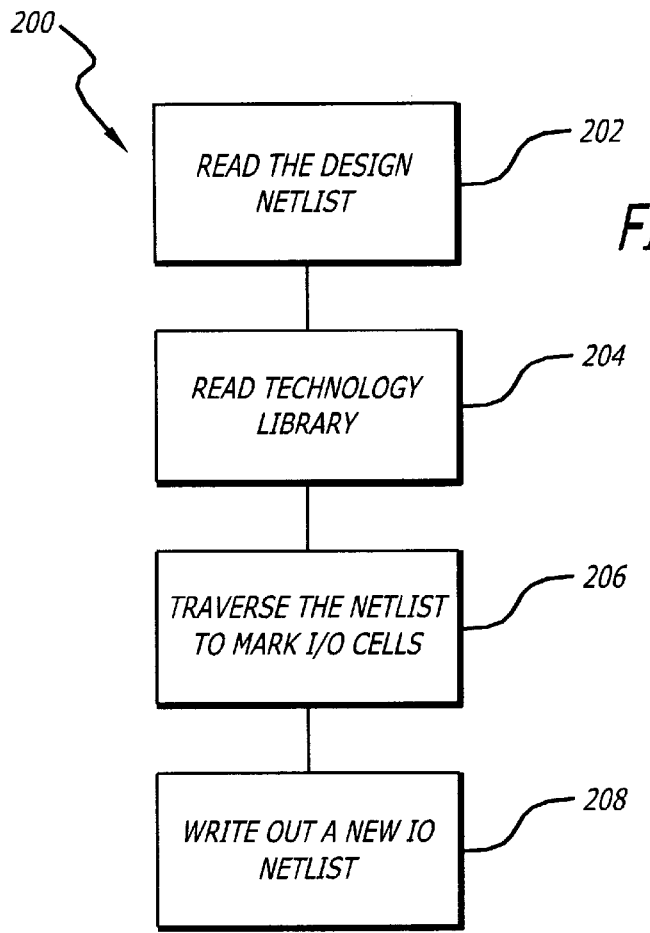
FIG. 2 is a flow chart illustrating a preferred embodiment of the present invention.

Referring to FIG. 2, a flow chart 200 illustrating the present invention is shown. As illustrated by the first box 202, a netlist is read. As already discussed, a netlist may be a list of cells including names of cells and names of nets that connect the pins of the cells.

A netlist defines an integrated circuit (IC) because it lists all the cells and all the nets of the IC design. A sample netlist is attached hereto as Appendix I. Often, a netlist includes a hierarchical structure of in inverse-tree formation having a top, or a root, module, sub-modules, and cells. In such a structure, the lowest level modules (having no sub-modules), are referred to as leaf modules. The sample netlist of Appendix I has only one level of modules. The top level module name is "i2c." See Appendix I, line 3. A netlist may be specified in any agreed-upon notation. Typically, netlists are defined using a high level design language such as Verilog or VHDL. The sample netlist of Appendix I is defined using NDL (Netlist Data List), which is a notation used by LSI Logic Corporation.

The netlist read in step 202 comprises cells. In order to determine the characteristics of the cells of the netlist, the cells of the netlist must be referenced to cell definitions contained in a technology library. Thus, the next step in the process of filtering a netlist is to read 204 a technology library. The technology library contains the characteristics and implementation details of the cells of the netlist as they are implemented in the selected technology.

Then, the netlist is traversed 206, and determination is made, for each cell of the netlist, as to whether the cell meets a predetermined criterion. The predetermined criterion may be any criterion used to filter the netlist to select a subset of the netlist. Or two or more criteria might be used simultaneously. In the example provided by Appendix II, the predetermined criterion is whether a cell is an input/output (I/O) cell. Appendix II is a listing of a program written in C language illustrating an implementation of the present invention to filter out all non-I/O cells from a netlist and create a new netlist containing only the I/O cells.

In the IC design and cell placement process, it is advantageous to place the I/O cells first because the IC cell placement can be used to determine whether the amount of space on the semiconductor die is sufficient for a feasible design.

Accordingly, the present inventive technique may be used to select the I/O cells and to filter out other cells from the netlist. Because the IC cells would comprise only a small portion of the entire netlist, placement of the I/O cells separately results in quicker placement analysis times and may lead to more efficient design.

Figure 3:
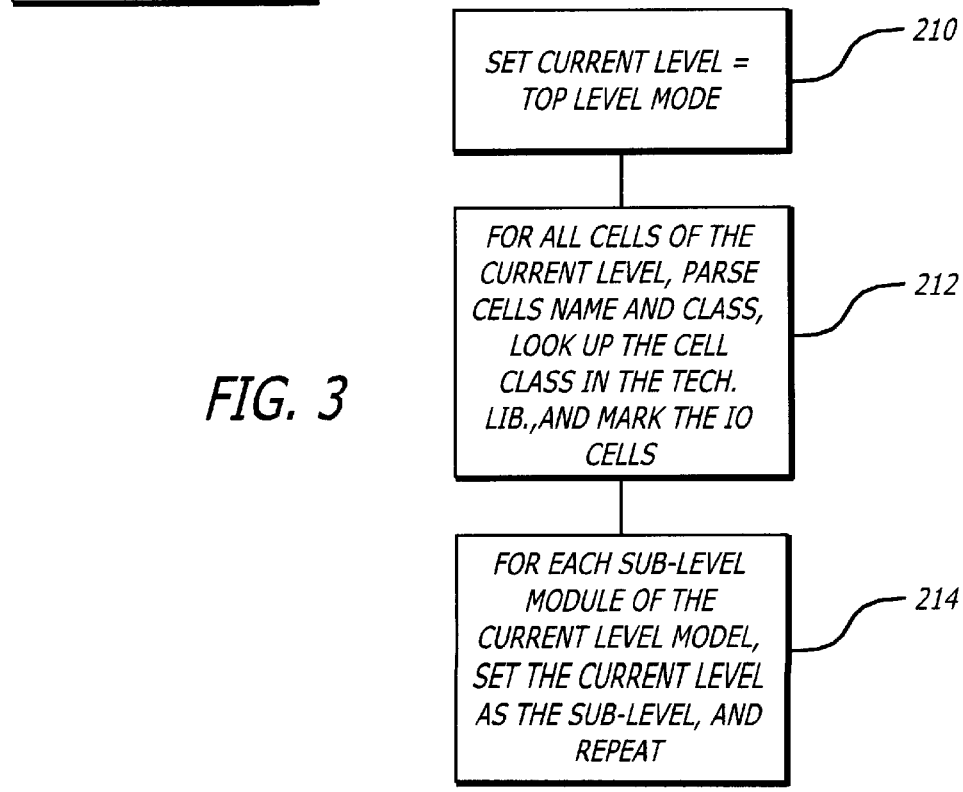
FIG. 3 is a flow chart detailing the traversal of the netlist as implemented by the present invention.

The implementation details of the step 206 of FIG. 2 are illustrated by FIG. 3. To traverse a hierarchical netlist, the Current Level is first set 210 to the top level module. Then, as indicated by the step 212, for all cells of the Current Level, the cell description is parsed, the cell is correlated to the corresponding cell in the technology library. If the cell meets a predetermined criterion, then the cell is marked. Otherwise, the cell is discarded, or "eaten." In the present example, the criterion is whether the cell is an I/O cell or not.

The sample netlist of Appendix I can be used to illustrated these steps. The 15 of Appendix I is as follows:

UUT_U73(UUT_P2_counter453_0_port=z)=n1a (UUT_n166=a);

This line shows that cell UUT_U73 has, as its output, line UUT_P2_counter453_0_port. The cell class of UUT_U73 is n1a having input line UUT_n166.

The cell name and class is parsed out, and the cell class, n1a, is correlated to the cell class in the technology library. If n1a is an output cell class, then cell UUT_U73 is marked as an output cell. If n1a is not an output cell class, then cell UUT_U73 is eaten. The process continues for each of the cells of the Current Level.

Because a netlist may have hierarchical organization, the above discussed analysis of each of the cells is repeated for each of the sub-level modules of the netlist as indicated by step 214.

Referring again to FIG. 2, all of the marked cells (which have met the predetermined criterion) are then written out 208 as a new netlist. Appendix III contains a new netlist filtered from the sample netlist of Appendix I using the I/O cell filtering technique as implemented by the program listed as Appendix II. Note that the first cell entry, line 15, of the new netlist of Appendix III is U96(SCLK2=z)=ibufdr(SCLK=a This indicates that cells UUT_U73 through UUT_S2_we_ff_reg, defined in lines 15 through 24, inclusive, of Appendix I are not I/O cells, and that cell U96 of class ibufdr defmed in line 25 of Appendix I is the first I/O cell of netlist module i2c.

Referring now to Appendix II, the C language implementation of a preferred embodiment of the present invention includes code to read command line options, and to check the file dates of the design netlist file and the new I/O netlist file. Lines 1 through 30 of Appendix II comprise administrative functions and definitions of various place holders, variables, used in the program. Lines 31 through 54 read command line options. For example, the output file name is set as an option. Lines 55, 56, and 160 to 194 check the last updates of the input file and the output file. If the output file was most recently updated, then the program exits. Line 56. Lines 57 to 61 obtain the data separator or delimiter. Lines 62 through 89 determine the language used to specify the netlist, read the netlist, and read the technology library. Lines 90 through 92 and lines 108 through 159 traverse the netlist and analyze the cells, marking the I/O cells. Lines 93 through 98 write the new I/O cell netlist. And, lines 99 through 107 are for administrative details such as freeing computer memory and closing console.

Design System Environment

Generally, the methods described herein with respect to IC design will be practiced with a general purpose computer, either with a single processor or multiple processors. Generally, RTL (Register Transfer Level) code will be supplied. The design steps thereafter, including use of the methods discussed herein, employed will then be performed by a general purpose computer.

Figure 4:
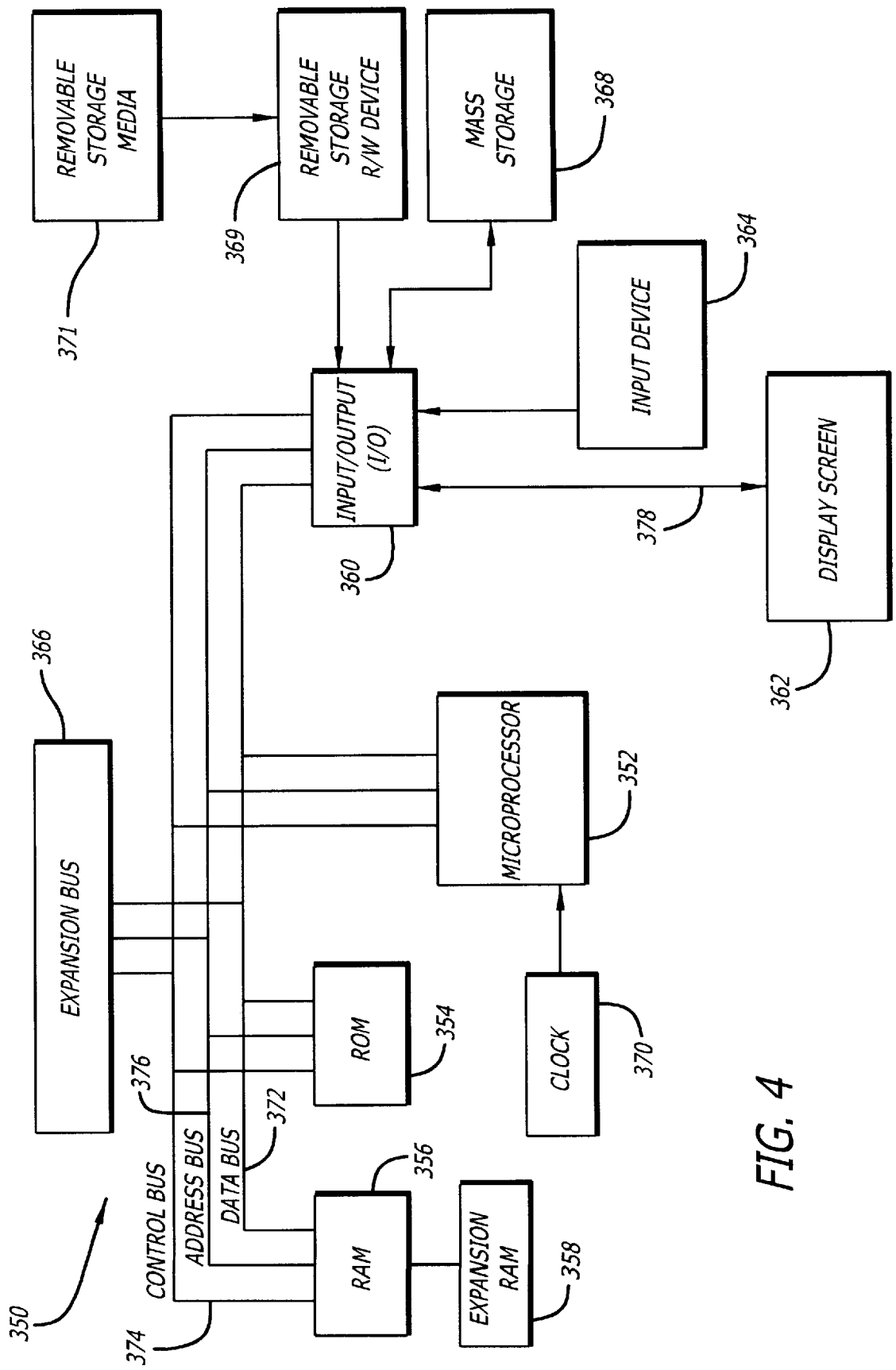
FIG. 4 is the environment in which the present invention is typically practiced.

FIG. 4 is an illustration of a general purpose computer system, representing one of many suitable computer platforms for implementing the inventive cell placement described above. FIG. 4 shows a general purpose computer system 350 in accordance with the present invention that includes a central processing unit (CPU) 352, read only memory (ROM) 354, random access memory (RAM) 356, expansion RAM 358, input/output (I/O) circuitry 360, display assembly 362, input device 364, and expansion bus 366. Computer system 350 may also optionally include a mass storage unit 368 such as a disk drive unit or nonvolatile memory such as flash memory and a real-time clock 370.

CPU 352 is coupled to ROM 354 by a data bus 372, control bus 374, and address bus 376. ROM 354 contains the basic operating system for the computer system 350. CPU 352 is also connected to RAM 356 by busses 372, 374, and 376. Expansion RAM 358 is optionally coupled to RAM 356 for use by CPU 352. CPU 352 is also coupled to the I/O circuitry 360 by data bus 372, control bus 374, and address bus 376 to permit data transfers with peripheral devices.

I/O circuitry 360 typically includes a number of latches, registers and direct memory access (DMA) controllers. The purpose of I/O circuitry 360 is to provide an interface between CPU 352 and such peripheral devices as display assembly 362, input device 364, and mass storage 368.

Display assembly 362 of computer system 350 is an output device coupled to I/O circuitry 360 by a data bus 378. Display assembly 362 receives data from I/O circuitry 360 via bus 378 and displays that data on a suitable screen.

The screen for display assembly 362 can be a device that uses a cathode-ray tube (CRT), liquid crystal display (LCD), or the like, of the types commercially available from a variety of manufacturers. Input device 364 can be a keyboard, a mouse, a stylus working in cooperation with a position-sensing display, or the like. The aforementioned input devices are available from a variety of vendors and are well known in the art.

Some type of mass storage 368 is generally considered desirable. However, mass storage 368 can be eliminated by providing a sufficient mount of RAM 356 and expansion RAM 358 to store user application programs and data. In that case, RAMs 356 and 358 can optionally be provided with a backup battery to prevent the loss of data even when computer system 350 is turned off. However, it is generally desirable to have some type of long term mass storage 368 such as a commercially available hard disk drive, nonvolatile memory such as flash memory, battery backed RAM, PC-data cards, or the like.

A removable storage read/write device 369 may be coupled to I/O circuitry 360 to read from and to write to a removable storage media 371. Removable storage media 371 may represent, for example, a magnetic disk, a magnetic tape, an opto-magnetic disk, an optical disk, or the like. Instructions for implementing the inventive method may be provided, in one embodiment, to a network via such a removable storage media.

In operation, information is inputted into the computer system 350 by typing on a keyboard, manipulating a mouse or trackball, or "writing" on a tablet or on position-sensing screen of display assembly 362. CPU 352 then processes the data under control of an operating system and an application program stored in ROM 354 and/or RAM 356. CPU 352 then typically produces data which is outputted to the display assembly 362 to produce appropriate images on its screen.

Expansion bus 366 is coupled to data bus 372, control bus 374, and address bus 376. Expansion bus 366 provides extra ports to couple devices such as network interface circuits, modems, display switches, microphones, speakers, etc. to CPU 352. Network communication is accomplished through the network interface circuit and an appropriate network.

Suitable computers for use in implementing the present invention may be obtained from various vendors. Various computers, however, may be used depending upon the size and complexity of the tasks. Suitable computers include mainframe computers, multiprocessor computers, workstations, or personal computers.

It should be understood that the present invention also relates to machine readable media on which are stored program instructions for performing methods of this invention. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

What is claimed is:

1. A method for placing cells on the surface of an integrated circuit device wherein the integrated circuit device has an associated first netlist, said first netlist containing different types of cells, said method comprising the steps of:

a. creating a second netlist by eliminating certain types of cells from the first netlist;

b. placing the cells contained in said second netlist onto the surface of the integrated circuit device; and c. upon completion of placement in step b, placing the cells contained in the first netlist that were not previously placed during step b onto the surface of the intergrated circuit device.

2. The method according to claim 1 wherein said second netlist contains only one type of cell.

3. The method according to claim 1 wherein said second netlist contains I/O cells and not logic cells.

4. The method according to claim 3 wherein said first netlist contains logic cells and I/O cells and the I/O cells are placed before the logic cells.

5. The method according to claim 4, wherein logic cells are eliminated from the first netlist in creating said second netlist.

6. A semiconductor device having cells placed thereon in accordance with claim 1.

7. An apparatus for placing cells on the surface of an integrated circuit device wherein the integrated circuit device has an associated first netlist, said first netlist containing different types of cells, said apparatus comprising:

a. means for creating a second netlist by eliminating certain types of cells from the first netlist;

b. means for placing the cells contained in said second netlist onto the surface of the integrated circuit device; and c. means for, upon completion of placement by means b, placing the cells contained in the first netlist that were not previously placed by means b onto the surface of the intergrated circuit device.

8. The apparatus according to claim 7 wherein said second netlist contains only one type of cell.

9. The apparatus according to claim 7 wherein the second netlist contains I/O cells and not logic cells.

10. The apparatus according to claim 9 wherein said first netlist contains logic cells and I/O cells and the I/O cells are placed before the logic cells.

11. The apparatus according to claim 10 wherein logic cells are eliminated from the first netlist in creating said second netlist.

12. A computer-readable medium storing computer-executable process steps for placing cells on the surface of an integrated circuit device wherein the integrated circuit device has an associated first netlist, said first netlist containing different types of cells, said process steps comprising steps to:

a. create a second netlist by eliminating certain types of cells from the first netlist;

b. place the cells contained in said second netlist onto the surface of the integrated circuit device: and c. upon completion of placement in step b, place the cells contained in the first netlist that were not previously placed during step b onto the surface of the intergrated circuit device.

13. The computer-readable medium according to claim 12 wherein said second netlist contains I/O cells and not logic cells.

* * * * *